(12) United States Patent
Gao et al.

(10) Patent No.: US 10,298,215 B2
(45) Date of Patent: May 21, 2019

(54) INTEGRATED CIRCUIT ELECTROSTATIC DISCHARGE PROTECTION

(71) Applicant: Globalfoundries Singapore Pte. Ltd., Singapore (SG)

(72) Inventors: Wei Gao, Singapore (SG); Yi Lu, Singapore (SG); Handoko Linewih, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 219 days.

(21) Appl. No.: 15/132,563

(22) Filed: Apr. 19, 2016

(65) Prior Publication Data

US 2017/0302066 A1    Oct. 19, 2017

(51) Int. Cl.
*H02H 9/04* (2006.01)
*H03K 5/08* (2006.01)
*H01L 27/02* (2006.01)

(52) U.S. Cl.
CPC ........... *H03K 5/08* (2013.01); *H01L 27/0285* (2013.01); *H02H 9/046* (2013.01)

(58) Field of Classification Search
CPC ......... H02H 3/20; H01L 27/0255; H03K 5/08

USPC ......................................................... 361/56
See application file for complete search history.

(56) References Cited

U.S. PATENT DOCUMENTS

| 2011/0304940 A1* | 12/2011 | Cao ................. | H01L 23/60 361/56 |
| 2014/0198414 A1* | 7/2014 | Worley .............. | H02H 9/046 361/56 |
| 2015/0124359 A1* | 5/2015 | Cao ................. | H02H 3/046 361/56 |

* cited by examiner

*Primary Examiner* — Kevin J Comber
(74) *Attorney, Agent, or Firm* — Lorenz & Kopf, LLP

(57) ABSTRACT

Integrated circuits (ICs) include electrostatic discharge protection including a transistor having a drain operably coupled to a first rail of the integrated circuit and a source operatively coupled to a second rail of the integrated circuit. A voltage regulating trigger circuit is operatively coupled to the first rail and to a gate of the transistor to turn on of the transistor responsive to an ESD event affecting the integrated circuit, wherein the voltage regulating trigger circuit limits a potential of the first rail to a first potential and a gate potential of the transistor to a second potential, less than the first potential but sufficient to turn the transistor on to conduct current arising from the ESD event from the first rail to the second rail.

12 Claims, 2 Drawing Sheets

INTEGRATED CIRCUIT ELECTROSTATIC DISCHARGE PROTECTION

TECHNICAL FIELD

The technical field generally relates to integrated circuits with electrostatic discharge protection, and in particular, the technical field relates to integrated circuits with electrostatic discharge protection and methods of providing electrostatic discharge protection for integrated circuits having a tri-rail configuration.

BACKGROUND

Electrostatic discharge (ESD) has been around since the beginning of time. It is the sudden flow of electricity between two electrically charged objects caused by contact, an electrical short, or dielectric breakdown. However, this natural phenomenon has only become an issue with the widespread use of semiconductor based integrated circuits and electronics.

All materials (insulators and conductors alike) are sources of ESD. These materials are lumped together in what is known as the triboelectric series, which defines the materials associated with positive or negative charges. Positive charges accumulate predominantly on human skin or animal fur. Negative charges are more common to synthetic materials such as plastics. The amount of electrostatic charge that can accumulate on any item, whether that charge be positive or negative, is dependent on the material and its capacity to store a charge.

The majority of present day integrated circuits (ICs) are implemented by using a plurality of interconnected field effect transistors (FETs), also called metal oxide semiconductor field effect transistors (MOSFETs or MOS transistors). A MOS transistor includes a gate electrode as a control electrode overlying a semiconductor substrate and spaced-apart source and drain regions in the substrate between which a current can flow. A gate dielectric is disposed between the gate electrode and the semiconductor substrate to electrically isolate the gate electrode from the substrate. A control voltage applied to the gate electrode controls the flow of current through a channel in the substrate underlying the gate electrode between the source and drain regions.

An integrated circuit may be subjected to an ESD event during the manufacturing process, assembly handling and in the ultimate system application. The energy associated with this transient discharge can easily damage the fragile devices present within the IC.

In the processing and handling of integrated circuits, ESD may originate from any number of sources such as a mechanical chip carrier, a plastic chip storage device, or even human interaction with the process. In each case it is possible that the integrated circuit is subjected to a voltage that is many times greater than its design voltage. The human body, for example, can store a charge equal to 250 picofarads. This correlates into a stored charge that can be as high as 25,000V. For integrated circuits that operate at voltages of less than, for example, 5V (volts), an electrostatic discharge on the order of several thousand volts can be devastating.

External pins or pads form the connection points for the integrated circuit to the outside world and therefore also serve as pathways for ESD events. An ESD event applied to a pad may couple the ESD voltage exceeding several thousand volts to circuitry coupled to the pad. Therefore, the coupling of ESD to the external pins is also of particular concern to the IC package and circuit designer.

In one conventional IC ESD protection scheme, often referred to as a dynamic trigger scheme, special clamp circuits are often used to shunt ESD current between the IC power supply rails and thereby protect internal elements from damage. A type of ESD clamp circuit, known as an active metal oxide semiconductor field effect transistor (MOSFET) clamp circuit, typically consists of three functional elements: an RC detector or trigger circuit, several stages of inverters and a large MOSFET transistor. The detector circuit is designed to respond to an applied ESD event but remain inactive during normal operation of the IC. The inverter stages are used to amplify the detector circuit output in order to drive the gate terminal of the large MOSFET transistor. The large MOSFET transistor, connected between the two power supply rails, acts as the primary ESD current dissipation device in the clamp circuit. Active MOSFET clamp circuits typically rely on only MOSFET action to shunt ESD current between the rails. Since the peak current in an ESD event may be on the order of amperes, very large MOSFET transistor sizes are required. Generally speaking, these arrangements are limited to ICs of two-rail constructions, e.g., Vdd and Vss rails, wherein all the gates are or should be driven to full Vdd potential.

Integrated circuit constructions of a tri-rail design provide a high or very high drain potential rail, e.g., VHdd 30V-100V or higher potential. Gate potentials are held substantially lower, e.g., VLdd~<6V. In these arrangements, the conventional RC circuit triggered clamp does not work.

Accordingly, it is desirable to provide ESD protection that is active and effective for ICs of a tri-rail design. In particular, the ESD protection should be effective in IC arrangements providing for VLdd substantially less than VHdd, i.e., VLdd<<VHdd.

Furthermore, other desirable features and characteristics will become apparent from the subsequent detailed description and the appended claims, taken in conjunction with the accompanying drawings and this background.

BRIEF SUMMARY

Integrated circuits (ICs) include electrostatic discharge protection including a transistor having a drain operably coupled to a first rail of the integrated circuit and a source operatively coupled to a second rail of the integrated circuit. A voltage regulating trigger circuit is operatively coupled to the first rail and to a gate of the transistor to turn on of the transistor responsive to an ESD event affecting the integrated circuit, wherein the voltage regulating trigger circuit limits a potential of the first rail to a first potential and a gate potential of the transistor to a second potential, less than the first potential but sufficient to turn the transistor on to conduct current arising from the ESD event from the first rail to the second rail.

In further embodiments, ICs with electrostatic discharge (ESD) protection and methods of providing ESD protection in an integrated circuit are provided. In an exemplary embodiment, an IC includes a high voltage (VHdd) rail, a low voltage (VLdd) rail and a reference (Vss) rail. An ESD protection circuit is configured to hold the VHdd rail at a predesigned clamp voltage less than a voltage of the VLdd responsive to an ESD event.

In accordance with herein described embodiments, in addition to clamping a VHdd rail to a hold voltage, a voltage limiting trigger circuit is provided to turn on a transistor of the protection circuit. The trigger circuit is configured to limit the gate voltage provided to the transistor to no more than VLdd, and for example, to not more than 6V. Limiting the gate voltage applied to the transistor greatly reduces stress on the transistor gate and further reduces the potential for gate oxide breakdown.

In accordance with additional embodiments, a voltage limiting trigger circuit is provided within an integrated circuit and is operatively coupled between a VHdd rail, a VLdd rail and a Vss rail and to a gate of a ESD transistor. The voltage limiting trigger circuit may include a diode stack including a plurality of diodes.

In accordance with a further additional embodiment, the diode stack may include a plurality of Zener diodes.

In a method providing ESD protection in a tri-rail device that includes VHdd, VLdd and Vss rails, in accordance with herein described embodiments, the potential of an VHdd rail is clamped to a hold voltage while a gate voltage applied to a clamping transistor is limited to VLdd or less.

In another embodiment, a method providing electrostatic discharge protection includes clamping a potential of a first rail to a hold potential; and enabling a transistor to conduct current from the first rail to a second rail by providing a second potential, less than the first potential, to a gate of the transistor.

Additional embodiments may include various combinations of the aforementioned features of the foregoing embodiments, and all such combinations are contemplated as being within the scope of this disclosure.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits, and methods for configuring and operating the same. The various structures, elements, tasks and steps described herein may be incorporated into a more comprehensive structure, procedure or process having additional elements, steps or functionality not described in detail herein. In particular, many structures, designs and methods of producing integrated circuits are well-known and so, in the interest of brevity, many conventional aspects of integrated circuits will only be mentioned briefly herein or will be omitted entirely without providing the well-known details.

Figure 1:
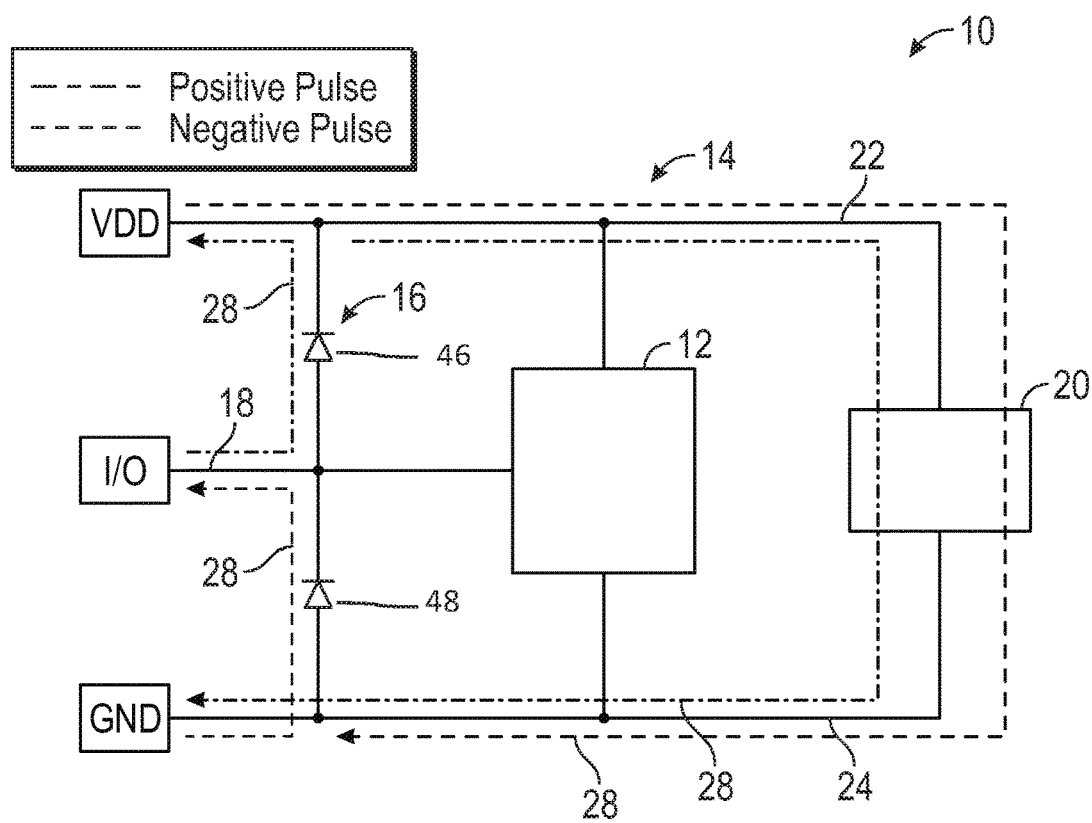
FIG. 1 is a schematic circuit diagram of an integrated circuit with at least one electrostatic discharge protection circuit in accordance with the herein described embodiments.

Referring to the exemplary embodiment depicted in FIG. 1, an integrated circuit (IC) 10 includes internal circuitry 12 and an ESD event triggered protection circuit 20. The protection circuit 20 protects a high potential (30V-100V or more) VHdd power supply rail 22, and hence the internal circuitry 12, from an ESD event, graphically depicted in FIG. 1 as ESD event 14, referenced to grounded Vss power supply rail 24.

The IC 10 further includes a double diode (pulling up and pulling down, respectively) network 16 that includes diodes 46 and 48. In a typical configuration, the diode 46 is a P+/N-well or P+/NW diode, while the diode 48 may be a N+/Substrate or N+/SX diode. The diode network 16 may be replaced with other ESD protection structures configured to direct current resulting from an ESD event to the protection circuit 20. Suitable structures may include N-FET-based or silicon controlled rectifier (SCR)-based ESD structures. One of skill in the art will appreciate that still other alternative arrangements may be utilized to appropriately direct or discharge ESD current within the IC responsive to an ESD event.

As noted, the diode network directs ESD event related current along desired paths for positive and negative ESD pulses, respectively. For example, FIG. 1 further illustrates possible current paths 28 resulting from a positive or negative ESD event at either the VHdd rail 22 or the VLdd rail 18. Forming the current path 28, the diodes 46 and 48 direct the ESD event related current away from the internal circuitry 12 allowing the protection circuit 20 to effectively clamp the ESD event related voltage and shunt the ESD event related current.

Figure 2:
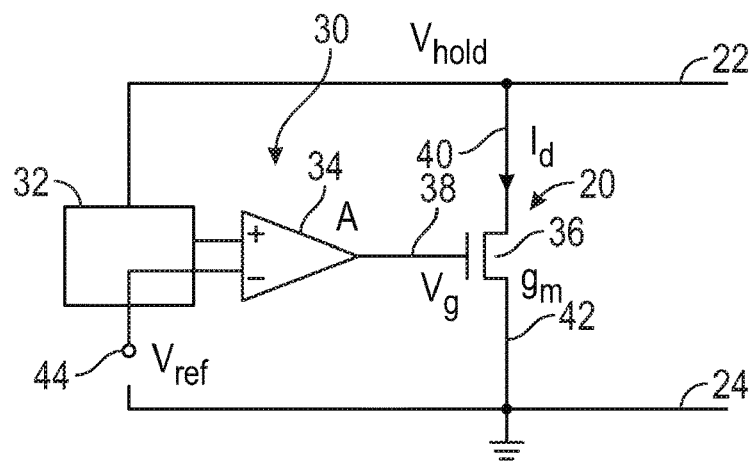
FIG. 2 is a schematic circuit diagram of an embodiment of an electrostatic discharge protection circuit that may be used in the IC configuration depicted in FIG. 1.

Protection circuit 20 as illustrated in FIG. 2 may include a voltage limiting trigger circuit 30. Together protection circuit 20 and trigger circuit 30 form an effective ESD protection arrangement to clamp ESD voltage below damaging levels and to shunt ESD current responsive to an ESD event affecting the IC 10. In an exemplary embodiment, the trigger circuit 30 clamps the potential of the VHdd rail 22 to a first potential while also turning on the transistor 36 by providing a gate 38 turn on voltage at a second potential less than the first potential such that the transistor 36 is operable to conduct current from the first rail VHdd 22 to the second rail Vss 24.

The trigger circuit 30 operatively couples a sampling circuit 32 and a pre-amp 34 to provide a gate voltage, Vg, to the gate 38 of the transistor 36, which is usually a nMOSFET, of the protection circuit 20. The drain 40 of the transistor 36 is operatively coupled to VHdd rail 22 and its source 42 to Vss rail 24. The sampling circuit 32 is operatively coupled to receive a reference voltage 44 and is further operatively coupled to VHdd rail 22. If the gain of the pre-amp 34 is A, and the transistor 36 has a transconductance gm, the holding voltage will be clamped as Vhold~=Vref as long as $A*gm \gg 1$.

Figure 3:
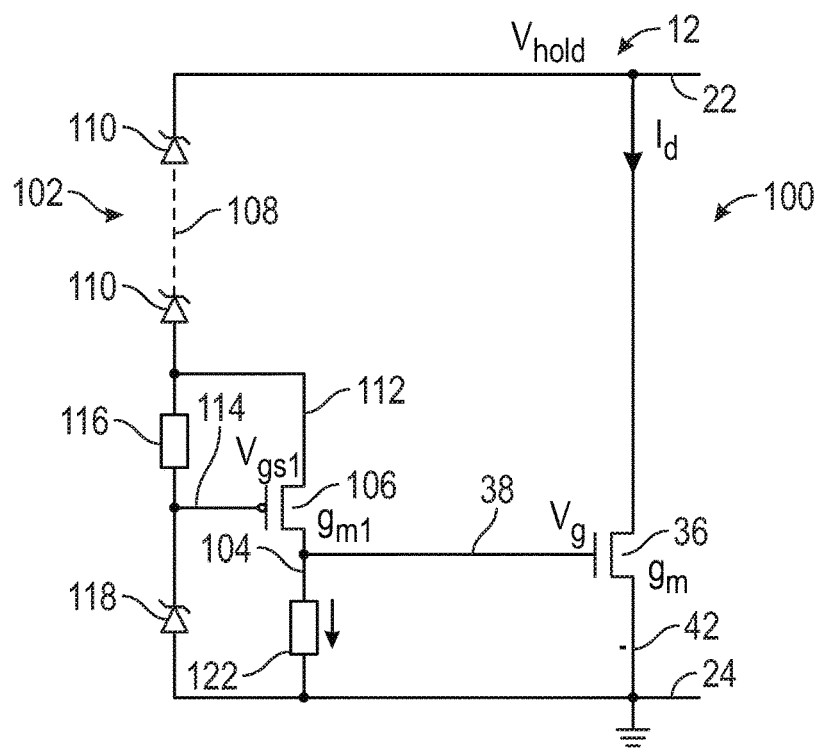
FIG. 3 is a schematic circuit diagram of an alternative embodiment of an electrostatic discharge protection circuit that may be used in the IC configuration depicted in FIG. 1.

FIG. 3 presents a protection circuit 100 in accordance with an alternative embodiment, and wherein like elements are identified with like reference numerals to the embodiment illustrated in FIG. 2. The protection circuit 100 includes transistor 36, such as an nMOSFET, that is operatively coupled between the VHdd rail 22 and the Vss rail 24. The gate 38 of the transistor 36 is coupled to a trigger circuit 102 at the source 104 of a trigger transistor 106 of the trigger circuit 102.

The trigger circuit 102 has as an operable element diode stack 108 that includes at least one, and in most implementations, several diodes 110. Depicted in FIG. 3 are two (2) diodes 110 in the diode stack 108. Each of the diodes 110 may be of the same type, and in the illustrated embodiment the diodes 110 are Zener diodes. As Zener diodes are known to act as ideal diodes in a forward direction, but to also allow current flow in the reverse direction responsive to the bias voltage exceeding the Zener breakdown voltage, e.g., a threshold voltage, the skilled person will appreciate that other suitable structures providing a low resistance forward path and a reverse current path responsive to a threshold voltage may be used in addition to or in place of the diode stack. Suitable structures may be N-FET or SCR-based.

The diodes 110 are reverse biased from VHdd rail 22 to the drain 112 of the trigger transistor 106 which may be a pMOSFET. The gate 114 of the trigger transistor 106 is operatively coupled via a resistor 116 to Vss rail 24 and the gate 114 is further coupled via a reverse biased diode 118 to Vss rail 24. The diode 118 may also be a Zener type diode. The source 104 of the trigger transistor 106 is operatively coupled to Vss rail 24 via a resistor 122.

In an embodiment, to ensure the trigger circuit 102, and in particular the trigger transistor 106, is off during normal operation, the voltage drop of the diode stack 108 in the trigger circuit 102 is made to be greater than the voltage of VHdd rail 22. The voltage of the diode stack 108 should satisfy $N*Vz > VHdd$; where N is the number of diodes 110 and Vz is the individual Zener diodes' reverse breakdown voltage.

During an ESD event, such as ESD event 12 as depicted in FIG. 1 affecting integrated circuit 10, the VHdd rail 22 is limited to a hold voltage Vhold, while the gate 114 of trigger transistor 106 is held at a voltage less than Vhold and/or VHdd, and to approximately VLdd. During the ESD event, the VHdd rail 22 holding voltage will be clamped to: $Vhold \sim = N*Vz + Vgs1$, where Vgs1 is the G/S voltage of the trigger transistor 106 and is typically from 1 to 2V.

Advantageously, the turn on resistance of the transistor 36 is low, providing associated benefit toward the dissipation of the ESD event 12. The turn on resistance, Ron, is determined as: $Ron = 1/(gm*gm1*R1)$, where gm is the transconductance of transistor 36, gm1 is the transconductance of the trigger transistor 106 and R1 is the resistance of the resistor 122 coupling the trigger transistor source 106 to Vss rail 24.

Thus it will be appreciated, in accordance with the herein described embodiments, responsive to an ESD event, electronic circuitry such as protection circuit 20 and trigger circuit 30, may be provided to clamp a potential of a VHdd rail 22 to a first or hold potential. The transistor 36 of the protection circuit 20 is turned on, e.g., enabled, to shunt current from the VHdd rail 22 to Vss rail 24. The gate voltage, Vg, of the transistor 36 is limited also by the trigger circuit 30 to a value that is less than Vhold and/or to the normal potential of VHdd rail 22.

Figure 4:
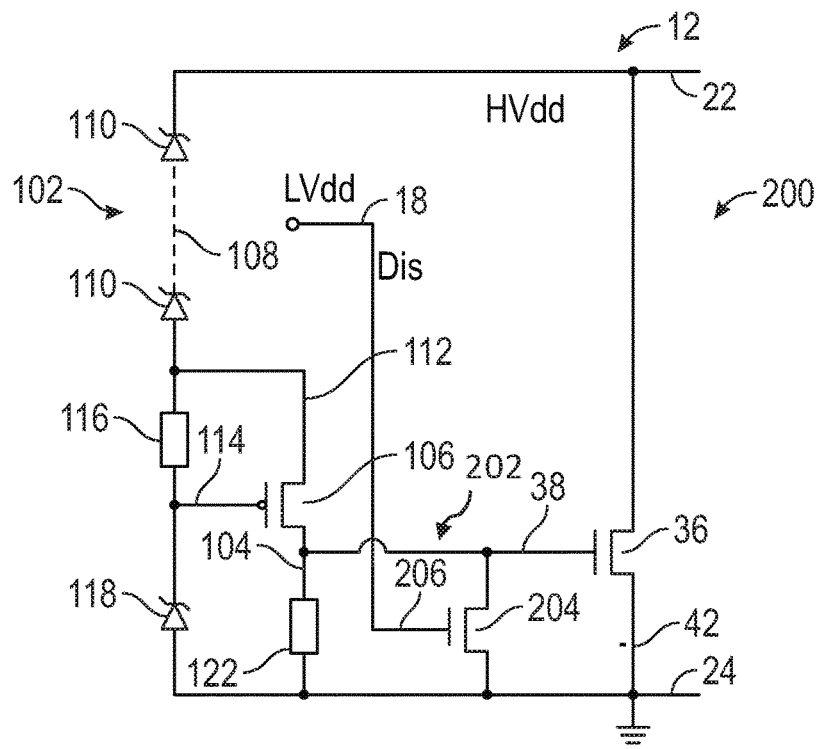
FIG. 4 is a schematic circuit diagram of an alternative embodiment of an electrostatic discharge protection circuit that may be used in the IC configuration depicted in FIG. 1.

FIG. 4 presents a protection circuit 200 in accordance with an alternative embodiment similar to the protection circuit 100, and wherein like elements are identified with like reference numerals as illustrated in FIG. 3. The protection circuit 200 includes transistor 36 that couples the VHdd rail 22 and the Vss rail 24. The gate 38 of the transistor 36 is coupled to the trigger circuit 102.

Within the trigger circuit 102, a disable/enable device 202 is provided. The disable/enable device 202 may be internally or externally addressed to disable/enable the trigger circuit 102. With the trigger circuit 106 disabled, the ESD protection circuit 20 is disabled. This ensures the ESD clamp circuit 20 does not interfere with normal operation of the IC 10.

In the embodiment illustrated in FIG. 4 that includes the disable/enable device 202, a transistor 204 of the disable/enable device 202, e.g., a n-field effect transistor (nFET) is coupled at the gate 38 of the transistor 36. The gate 206 of the transistor 204 may be coupled to VLdd rail 18. In the illustrated configuration, the disable/enable device 202 is high-effective. As a result, upon normal chip-on operation, with VLdd rail 18 at its operative potential, the disable/enable device disables the protection circuit 200. During manufacturing processes or other handling of the IC, without power application to the IC 10, the disable/enable device 202 enables the protection circuit 200.

It will be appreciated from the foregoing discussion, that a method of dissipating an ESD event within an IC circuit with a tri-rail configuration may include providing a clamp circuit and a trigger circuit. The clamp circuit and the trigger circuit are operative such that upon an ESD event, the trigger circuit engages the clamp circuit to act as a power clamp to limit damaging effects of the ESD event. The clamp circuit limits a voltage on the VHdd rail of the IC to a hold voltage, while the trigger circuit operates and limits a gate voltage of the transistor to much less than the VHdd rail voltage, and to VLdd, for example, or approximately 6V in some embodiments to turn on a transistor.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit electrostatic discharge (ESD) protection circuit comprising:

a transistor having a drain operably coupled to a first rail of the integrated circuit and a source operatively coupled to a second rail of the integrated circuit the first rail being at a first voltage potential and the second rail being a second voltage potential, less than the first voltage potential; and a voltage regulating trigger circuit operatively coupled to the first rail and to a gate of the transistor to drive the transistor responsive to an ESD event affecting the integrated circuit, wherein the voltage regulating trigger circuit limits a potential of the first rail to the first potential and a gate potential of the transistor to a third voltage potential, less than the first voltage potential but sufficient to turn the transistor on to conduct current arising from the ESD event from the first rail to the second rail, the third voltage potential corresponding to a voltage potential of a third rail of the integrated circuit and a high effective disable/enable device is coupled to the voltage regulating trigger circuit, the high effective disable/enable device being operative to disable the trigger circuit during normal chip-on operation.

2. The ESD protection circuit of claim 1, wherein the third rail voltage potential is at or below 6V (volts).

3. The ESD protection circuit of claim 1, the transistor comprising a nMOSFET.

4. The ESD protection circuit of claim 1, wherein the voltage regulating trigger circuit comprises a voltage clamp.

5. The ESD protection circuit of claim 4, wherein the voltage clamp comprises a diode stack operatively coupled between the first rail and the gate.

6. The ESD protection circuit of claim 1, the disable/enable device comprising a low potential addressable transistor, a gate of which is operably coupled to a third rail voltage potential.

7. An integrated circuit comprising:
a first rail at a first voltage potential, a second rail at a second voltage potential and a third rail at a third voltage potential, wherein the first voltage potential, the second voltage potential and the third voltage potential are all different from each other,
an electrostatic discharge (ESD) protection circuit disposed within the integrated circuit and operatively coupled to the first rail, the second rail and the third rail, the ESD protection circuit including a transistor operably disposed between the first rail and the second rail, and a voltage regulating trigger circuit coupled to the first rail and to the transistor to turn on of the transistor responsive to an ESD event, wherein
the voltage regulating trigger circuit limits a potential of the first rail to the first voltage potential and a gate voltage potential of the transistor to the third voltage potential, less than the first voltage potential, such that the transistor is enabled to conduct current from the first rail to the second rail responsive to an ESD event and
a high effective disable/enable device is coupled to the voltage regulating trigger circuit, the high effective disable/enable device being operative to disable the trigger circuit during normal chip-on operation.

8. The integrated circuit of claim 7, wherein the third rail voltage potential is at or below 6V (volts).

9. The integrated circuit of claim 7, the transistor comprising a nMOSFET having a drain coupled to the first rail, a source coupled to the second rail, and a gate coupled to the voltage regulating trigger circuit.

10. The integrated circuit of claim 7, wherein the voltage regulating trigger circuit comprises a voltage clamp.

11. The integrated circuit of claim 10, wherein the voltage clamp comprises a diode stack operatively coupled between the first rail and a gate of the transistor.

12. The ESD protection circuit of claim 7, the disable/enable device comprising a low potential addressable transistor, a gate of which is operably coupled to a third rail voltage potential.

* * * * *